United States Patent [19]

Korn et al.

[11] 3,816,763

[45] June 11, 1974

[54] ZERO VOLTAGE SWITCHING PHOTON COUPLED RELAY

[75] Inventors: Sebald R. Korn, Auburn; Richard W. Fox, Marcellus; William H. Sahm, III, Syracuse, all of N.Y.

[73] Assignee: General Electric Company, Syracuse, N.Y.

[22] Filed: Oct. 2, 1972

[21] Appl. No.: 293,816

[52] U.S. Cl.... 307/252 UA, 307/252 A, 307/252 B, 307/252 T, 323/21

[51] Int. Cl. .......................................... H03k 17/00

[58] Field of Search..... 307/252 A, 252 B, 252 UA, 307/252 T, 311; 323/21

[56] References Cited

UNITED STATES PATENTS

| | | | |
|---|---|---|---|
| 3,328,606 | 6/1967 | Pinckaers | 307/252 B |
| 3,693,060 | 9/1972 | Joyce | 307/252 T |
| 3,708,672 | 1/1973 | Marinkovic | 307/252 A |
| 3,723,769 | 3/1973 | Collins | 307/252 UA |

OTHER PUBLICATIONS

"Optical Link Isolates Low-Cost Solid State Relay" in EDN/EE (Progress in Products) dtd 5/15/71, page 69.

*Primary Examiner*—Stanley D. Miller, Jr.
*Attorney, Agent, or Firm*—Robert J. Mooney

[57] ABSTRACT

A solid state relay or controlled switch which may be utilized in place of an electromechanical relay to conduct AC power from a source to a load. The solid state relay includes a load current carrying portion and a control portion which has complete and permanent electrical isolation from the load current carrying portion. The load current carrying portion is controlled exclusively by photon coupling between a photon generator in the control portion and a photon-activated element in the load current carrying portion. A variable impedance device affects the photon switching sensitivity of the photon-activated element and provides the logic necessary for switching at essentially a zero voltage.

6 Claims, 4 Drawing Figures

ZERO VOLTAGE SWITCHING PHOTON COUPLED RELAY

BACKGROUND OF THE INVENTION

1. Field of the Invention

This invention relates to an improved solid state relay or controlled switch for connecting an alternating current source to a load. More particularly, the invention relates to a switching circuit employing a photon coupling between a control portion and a load current carrying portion, and wherein switching is achieved at or near the zero instantaneous amplitude value of the AC load current supply voltage wave. The invention may be used advantageously in situations where zero voltage switching is desired and where complete and permanent electrical isolation between a relatively low power control signal input and a relatively high power switched current output is desired.

2. Description of Prior Art

The prior art reveals several attempts to use electronic circuits as substitutes for the conventional electromechanical relay. Generally, these circuits lack the capability of initiating or terminating the flow of alternating current at the exact instant when the instantaneous amplitude of the applied AC voltage is equal to or near zero. The prior art electronic circuits which have achieved zero voltage switching have generally required energy storage components such as capacitors and inductors to provide switching energy when the applied AC voltage is equal to or near zero. These required energy storage components have resulted in complex circuits. Additionally, these energy storage components have prevented the desired integration of the circuit. Further, the prior art electronic circuits have failed to provide complete and total electrical isolation between the control signal input portion and the load current carrying output portion, due to the electrical interconnection of these two portions.

The present invention avoids the foregoing problems by providing a solid state zero voltage switching relay requiring no energy storage components, being readily integratable into a compact all-solid state circuit, using photon coupling to achieve complete and total electrical isolation between the control portion and the load current carrying portion of the circuit, and providing switching capability when the instantaneous amplitude of the AC load current supply voltage is at or near zero.

SUMMARY OF THE INVENTION

It is a general object of this invention to provide a new and improved solid state relay capable of initiating or terminating current flow between its load current terminals at a time when the instantaneous AC load current supply voltage is equal to or near zero.

It is another object of this invention to provide a new and improved solid state relay which so controls the switching sensitivity as to achieve the greatest sensitivity when the AC load current supply voltage approaches zero magnitude.

Still another object of the invention is to provide a new and improved solid state relay having complete and total isolation between its control and load current carrying portions.

A further object of the invention is to make available a compact, self-contained solid state relay capable of being integrated as a semiconductive device.

A further object of the invention is to provide a new and improved four terminal solid state relay capable of conducting high currents.

In one embodiment of the invention, a control portion of the solid state relay includes a photon generator, for example a light emitting diode (LED). The photon generator is connected between two control signal input terminals and is adapted to emit photons or light when electrically energized. A load current carrying portion of the circuit includes at least one photon-activated switching means, for example a light activated silicon controlled rectifier (LASCR). Two main current carrying electrodes of the photon-activated switching means connect respectively to two load current terminals for conducting alternating current between these terminals.

The switching sensitivity of the photon-activated switching means is inversely varied in relation to the amount of photon-generated current drawn from its gate electrode. A means for controlling the gate electrode current, which for example may include a variable impedance device or transistor, controls the current drained from the gate electrode. To provide for switching at or near the point of zero instantaneous amplitude of the voltage between the load current terminals, a bias signal generating means, connected to the load current terminals, supplies a control signal to the means for controlling the gate electrode current. The bias signal generating means and the means for controlling the gate electrode current thereby vary the switching sensitivity of the photon-activated switching means to provide for the desired zero voltage switching.

When the instantaneous amplitude of the voltage present between the load current terminals is at or near zero, the bias signal generating means provides an inadequate bias signal to the means for controlling the gate electrode current, and it does not drain significant photon-generated current from the gate electrode. Under these conditions the photon-activated switching means is the most sensitive for triggering by photons. When sufficient voltage appears between the load current terminals, the bias signal generating means provides an adequate signal for overcoming the threshold of operation of the means for controlling the gate electrode current, and any photon-generated current is effectively drained from the gate electrode. As a result, the photon-activated switching means then is rendered insensitive to triggering by the photons emitted from the photon generator. Thus, the switching sensitivity of the solid state relay is the greatest when the voltage between its load current terminals is the least.

Other embodiments of the invention describe the solid state relay connected to a high current switch, such as a bidirectional triode thyristor or two parallel inverse connected SCR's, to provide a capability for switching high magnitude alternating currents at or near zero magnitude of the AC load current supply voltage.

BRIEF DESCRIPTION OF THE DRAWINGS

A more complete understanding of this invention may be had by reference to the accompanying detailed description and drawings in which.

DETAILED DESCRIPTION OF THE INVENTION

Figure 1:
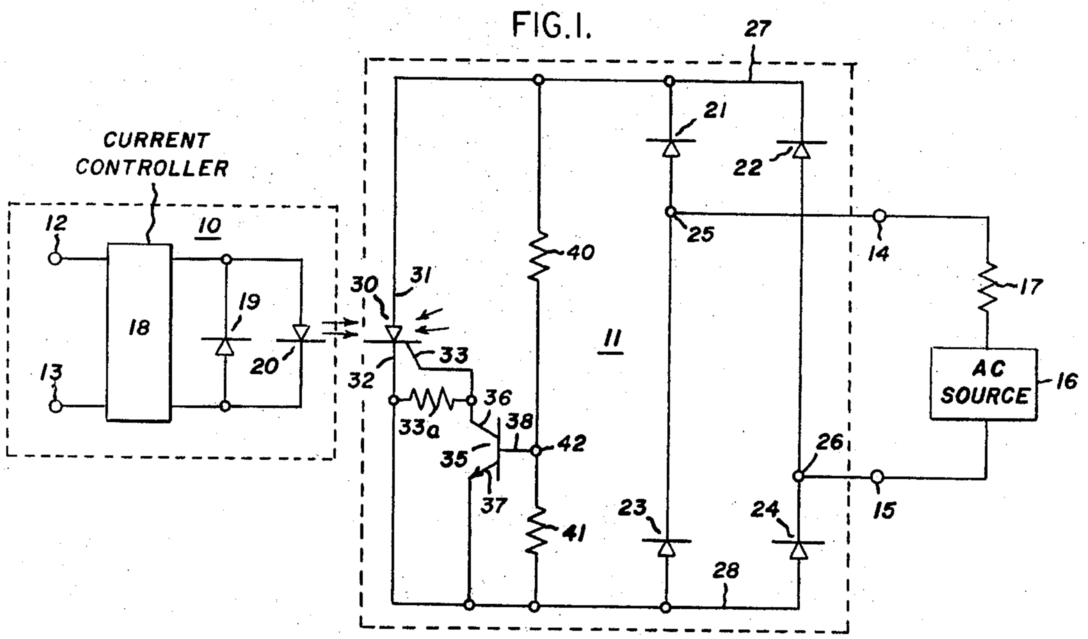
FIG. 1 is a schematic diagram of a solid state, zero voltage switching relay constituting one embodiment of the present invention.

Referring to FIG. 1, one embodiment of the solid state zero voltage switching relay is shown. In general, the relay has a control portion 10 and a load current carrying portion 11. Load current supplied from an AC source 16 through a load 17 is conducted between a pair of load current terminals 14 and 15 when the control portion 10 causes the load current carrying portion 11 to become conductive. The control portion 10 is completely and totally electrically isolated from the load current carrying portion 11 due to the lack of any electrical connection between these two portions.

The solid state relay has the capability of initiating or terminating the flow of alternating current through the load terminals 14 and 15 when the instantaneous AC voltage between terminals 14 and 15 is equal to or near zero. The term "zero voltage" used in relation to the capability for conducting current through the load terminals is used generally to reference that range of potential near zero, for example from zero to five volts.

Even though, under a zero voltage condition, no significant electrical power is supplied to the load current carrying portion 11 by the AC source 16, the photon energy transmitted from the control portion 10 provides a switching capability in the load current carrying portion at this instant.

The word "photon" is used throughout this description in the sense well known in the art to indicate a quantity of electromagnetic radiation, and since light is one form of electromagnetic radiation, it is included within the definition.

In the control portion 10 an electrical control signal is applied to a pair of control signal input terminals 12 and 13. A current controller 18 controls the magnitude and direction of the current supplied to a photon generator, for example a light-emitting diode (LED) 20. An optional diode 19 may be connected inversely in parallel with the LED 20 to protect the LED 20 from reverse bias voltages.

In the load current carrying portion 11, a diode bridge or other suitable means for rectifying an alternating current applied at the load current terminals 14 and 15 produces direct current of a voltage related to the absolute value of the AC voltage supplied at the load current terminals 14 and 15. The diode bridge comprises diodes 21, 22, 23 and 24 connected in a manner well known in the art to form a full wave diode bridge. Input terminals 25 and 26 to the diode bridge are connected respectively to the load current terminals 14 and 15. The direct current output of the diode bridge appears on a positive DC conductor 27 and a negative DC conductor 28.

A photon-activated switching means, for example a light-activated silicon controlled rectifier (LASCR) 30, switches the rectified load current between the DC conductors 27 and 28. Triggering energy for the LASCR is supplied by the photons radiating from the LED 20. An anode electrode 31 and a cathode electrode 32 of the LASCR 30 are its main current carrying electrodes and are electrically connected by the full wave diode bridge to the load current terminals 14 and 15.

A LASCR is characteristically less sensitive or susceptible to triggering when the effect of the current generated by the irradiating photons is reduced. The photons generate current in the gate region of the LASCR, and if this current is drained from the gate region, the LASCR will be less sensitive for switching. The relationship between the photon-generated current drained from the gate and the switching sensitivity is that a greater drainage of photon-generated current current creates a lesser switching sensitivity. Thus, photon sensitivity of LASCR is reduced in proportion to the amount of current flowing through the gate electrode 33.

The switching sensitivity of the LASCR 30 is controlled by a means for controlling the gate electrode current flow, which includes a bias signal-responsive variable impedance device, for example an NPN transistor 35. The NPN transistor 35 is connected in a series circuit relation with the gate electrode 33 of the LASCR 30 by the connection of NPN transistor's collector electrode 36 to the gate electrode 33. An emitter electrode 37 connects to a cathode electrode 32 of the LASCR 30. Bias signals are introduced through a base electrode 38 of transistor 35. The NPN transistor 35 controls the amount of current flowing from the gate electrode 33 of the LASCR 30 and thereby controls its switching sensitivity.

If desired, a resistor 33a may be provided to establish a high impedance between the gate electrode 33 and the cathode electrode 32 of the LASCR 30. The resistor 33_a_ reduces the sensitivity of the LASCR 30 to $dv/dt$ effects and leakage current effects, while at the same time maintaining the desired photon sensitivity for the LASCR 30.

A bias signal is derived from a bias signal generating means which in FIG. 1 comprises two resistors 40 and 41. The bias signal generating means, connected to the DC conductors 27 and 28, is electrically connected through the diode bridge to the load current terminals 14 and 15. The base electrode 38 of the transistor 35 is electrically connected to a signal junction 42 of the bias signal generating means.

The magnitude of the bias signal at the signal junction 42 is proportional to the value of the instantaneous voltage difference between conductors 27 and 28 and to the ratio of values of the resistances 40 and 41. As previously indicated, the voltage between conductors 27 and 28 is a DC voltage whose magnitude follows the absolute value of the AC voltage at the load current terminals 14 and 15. A certain threshold bias signal level must be exceeded before the transistor 35 becomes conductive to initiate current drain from the gate electrode 33 of the LASCR 30. Varying the ratio of resistances 40 and 41 will vary bias signal magnitude relative to the voltage between conductors 27 and 28. This resistance ratio determines the conduction threshold of transistor 35 relative to the instantaneous AC voltage difference between terminals 14 and 15, since the DC voltage between conductors 27 and 28 follows the absolute value of this AC voltage between terminals 14 and 15.

The solid state relay of FIG. 1 described above functions as follows. An electrical control signal applied to the control signal input terminals 12 and 13 causes the LED 20 to radiate photons. The photons from the LED 20 are coupled to the LASCR 30. At the instant when the voltage difference between the load current terminals 14 and 15 is equal to or near zero, the DC voltage difference between conductors 27 and 28 is also equal to or near zero. The bias signal produced at the signal junction 42 of the bias signal generating means is equal to or near zero and is insufficient to cause the transistor 35 to assume a conductive state. In a nonconductive state the transistor 35 is essentially an infinite impedance in parallel with the impedance of resistor 33*a*, which provides a high impedance path for the photon-generated current flowing from the gate electrode 33 of the LASCR 30. As previously discussed, when little current flows from the gate electrode, the LASCR 30 is the most sensitive to switching, and the photons radiating from the LED 20 trigger the LASCR 30. The LASCR 30 conducts current from its anode electrode 31 to its cathode electrode 32 whenever a voltage difference appears between the conductors 27 and 28. Due to the action of the diode bridge, a voltage difference between conductors 27 and 28 is established when the instantaneous AC voltage difference between the load current terminals 14 and 15 is not equal to zero.

However; if insufficient photons are generated to trigger the LASCR at or near zero load current terminal voltage, the voltage difference between the load current terminals 14 and 15 increases, a voltage difference between conductors 27 and 28 is attained which, due to the ratio of resistors 40 and 41, produces a bias signal sufficient to overcome the conduction threshold of transistor 35. Transistor 35 assumes a conductive state and the photon-generated current is drained from the gate electrode 33 of the LASCR 30, reducing the sensitivity of the LASCR 30 such that triggering is inhibited until the next instant when the voltage difference between the load current terminals 14 and 15 is equal to or near zero.

The foregoing process repeats itself for each half cycle of AC voltage between the load current terminals 14 and 15.

The description of the zero voltage switching relay of FIG. 1 readily illustrates its capability for conducting current at a zero voltage condition of the load current supply; its potential for being integrated as a compact, all-solid state semiconductive device; and its inherent total and complete electrical isolation between the control and current carrying portions.

Figure 2:
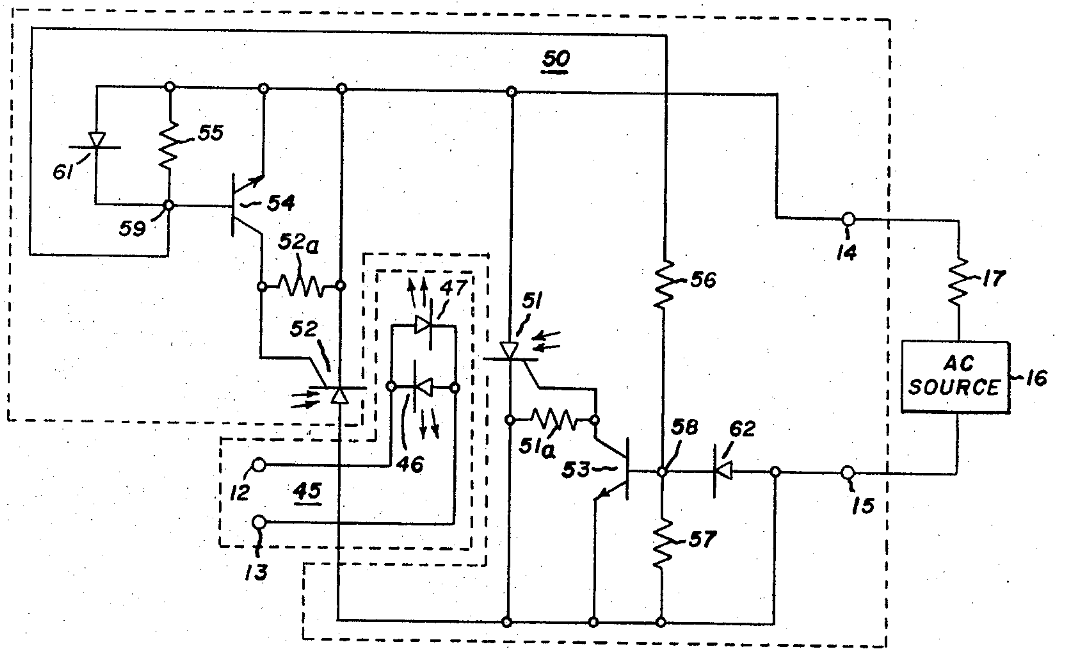
FIG. 2 is a schematic diagram of an alternative embodiment of the invention.

FIG. 2 is another embodiment of the solid state relay. This embodiment eliminates the necessity of the diode bridge and increases the power handling capability of the relay since more than one photon-activated switching means is provided to carry the load current.

An alternative control portion 45 in FIG. 2, corresponding to control portion 10 in FIG. 1, has control signal input terminals 12 and 13 to which two LED's 46 and 47 are connected in a parallel inverse relationship. The control portion 45 may be used without regard to the polarity of the input signal since photons will be produced by either LED 46 or 47 depending upon the input voltage polarity. The alternative control portion 45 of FIG. 2 may be interchangeably substituted for the control portion 10 of FIG. 1.

In the load current carrying portion 50 of the relay of FIG. 2, two photon-activated switching means or LASCR's 51 and 52 are connected in an inverse parallel relation by main current carrying anode and cathode electrodes. This parallel inverse relationship allows one LASCR to conduct each half cycle of the AC current between the load current terminals 14 and 15. When one LASCR is conducting, the other is nonconducting since it is reverse biased. Both LASCR's 51 and 52 characteristically have reduced photon sensitivity in proportion to the current drained from the gate electrode of each LASCR.

Associated with each LASCR is a means for controlling its gate electrode current flow. A bias signal responsive variable impedance device or NPN transistor 53 is associated with the LASCR 51 by being connected in a series circuit relation with the gate electrode of the LASCR 51. In a similar manner, the bias signal responsive variable impedance device or NPN transistor 54 is associated with the LASCR 52 by being connected in a series circuit relation with the gate electrode of the LASCR 52. Both means for controlling the gate electrode current flow in FIG. 2 are in all respects similar to the connection and function of the transistor 35 associated with LASCR 30 in FIG. 1. The resistors 51*a* and 52*a* are connected and function similarly to resistor 33*a* in FIG. 1.

A bias signal generating means comprising resistors 55, 56 and 57 is shown connected between the load current terminals 14 and 15. The junction between resistors 56 and 57 is a first signal junction 58 which supplies a bias signal to the base electrode of the NPN transistor 53. The junction between resistors 55 and 56 is a second signal junction 59 which similarly provides a bias signal to the base electrode of the NPN transistor 54.

Similar to the situation described in FIG. 1, the ratios of the resistances 55, 56 and 57 may be varied to alter the magnitude of the bias signals present at the signal junctions 58 and 59. The magnitude of the bias signals sets the threshold for conduction of the transistors 53 and 54 and provides a variable switching sensitivity for each LASCR 51 and 52 respectively associated with the transistors 53 and 54.

Diodes 61 and 62 are respectively connected between the base and emitter electrodes of transistors 54 and 53 to prevent emitter diode avalanche.

The inverse parallel connection of the LASCR's 51 and 52 and their associated transistors 53 and 54 allows only one LASCR and transistor to conduct during each half cycle of AC voltage. When one LASCR and its associated transistor are conducting, the other LASCR and its associated transistor are reverse biased and nonconducting. Only the bias signal received by the forward biased transistor causes it to conduct; the bias signal applied to the other transistor has no effect since that transistor is reverse biased. Thus, the bias signal generating means maintains only the forward biased transistor in a current conduction state. For example, when a sufficiently greater voltage is present at load current terminal 14 than at load current terminal 15, the LASCR 51 and the transistor 53 will be conducting. The LASCR 52 and transistor 54 are reverse biased and cannot conduct. The bias signal at the first signal junction 58 causes the transistor 53 to assume a conductive state, while a bias signal at the second signal junction 59 has no effect on the reverse biased transistor 54.

The solid state relay of FIG. 2 functions as follows. Assume the instantaneous AC voltage between the load current terminals 14 and 15 is zero. Due to the zero voltage difference between the cathode and anode electrodes of LASCR's 51 and 52, neither LASCR is conducting. Since one of the two LED's 46 and 47 is supplying photons necessary for triggering the LASCR's, as the AC source 16 begins to provide a positive half cycle of AC voltage and a greater voltage appears on terminal 14 than on terminal 15, the LASCR 51 begins to conduct current between the load current terminals 14 and 15 and conducts the positive half cycle of AC current. The photons falling on the LASCR 52 have no effect since it is reverse biased.

If insufficient photons are generated to trigger the LASCR, the voltage difference between terminals 14 and 15 increases and when the bias signal present at the first signal junction 58 of the bias signal generating means attains a level sufficient to exceed the threshold for conduction of transistor 53, and as a result the transistor 53 turns on and conducts the photon-generated current from the gate electrode of the LASCR 51, which in turn reduces its sensitivity of triggering such that triggering is inhibited until at least the next half cycle of the AC supply voltage. During the negative half cycle when the voltage at terminal 15 is greater than that at terminal 14, the LASCR 52 is triggered into conduction by the photons and the negative half cycle of AC current is conducted. If LASCR 52 is not triggered, the voltage difference between the terminals 14 and 15 will reach a sufficient magnitude such that the bias signal at the second signal junction 59 exceeds the threshold of conductivity of transistor 54 and the resulting turn-on of transistor 54 reduces the photon sensitivity of the LASCR 52 such that triggering is inhibited until the next instant when the voltage difference between terminals is zero. The LASCR 51 and transistor 53 are reverse biased and nonconductive, so the bias signal at the first signal junction 58 has no effect. The relay of FIG. 2 thus functions as described to conduct AC current between the load current terminals 14 and 15.

Figure 3:
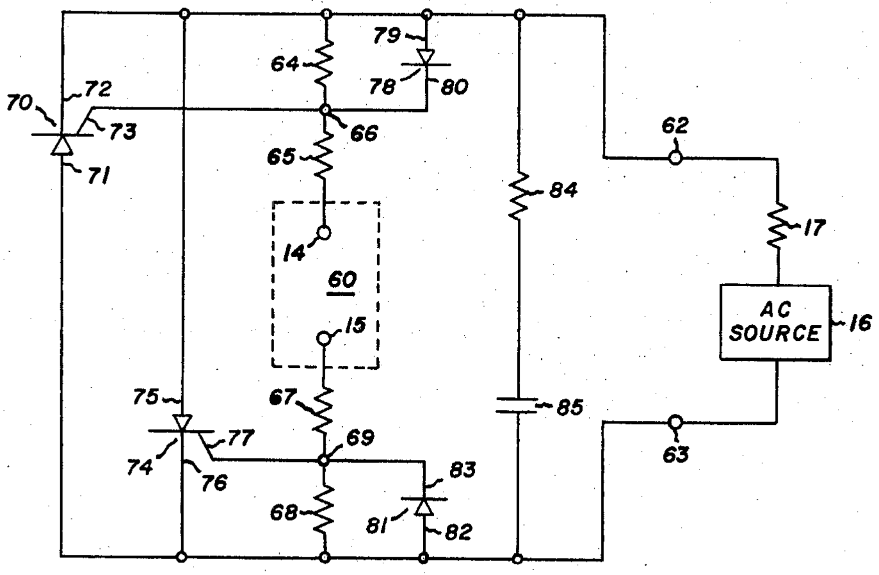
FIG. 3 is a schematic diagram of another embodiment of the invention particularly suitable for switching relatively high currents.
Figure 4:
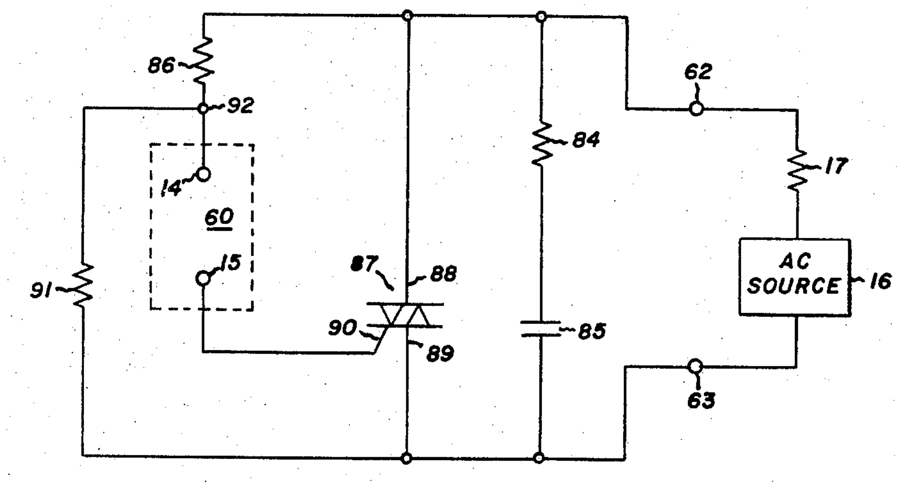
FIG. 4 is an alternative form of the circuit of FIG. 3.

Either of the two solid state relays previously described may be combined with either of the high current switches shown in FIG. 3 or 4 to provide a capability for switching a relatively high alternating current. The term "relatively high current," although not intended to be limited to a specific lower amount, is generally used to reference a current which would exceed the permissible current ratings of the relays described in FIGS. 1 and 2.

The high current switches of FIGS. 3 and 4 are intended for use with either zero voltage switching relay shown in FIG. 1 or 2. The high current switches are connected to the zero voltage switching relays, referenced generally as 60 in FIGS. 3 and 4, at the load current terminals 14 and 15. The AC source 16 and load 17 in this situation are connected to a pair of high current terminals 62 and 63.

Referring now to FIG. 3, the high current switch comprising SCR's 70 and 74 switches relatively high currents between high current terminals 62 and 63. A cathode electrode 72 of the SCR 70 and an anode electrode 75 of the SCR 74 connect to the high current terminal 62, while an anode electrode 71 of the SCR 70 and a cathode electrode 76 of the SCR 74 connect to the other high current terminal 63. By this arrangement the SCR's 70 and 74 are connected in a parallel inverse relation whereby the SCR's conduct half cycles of AC current.

The AC current is coupled to the load current terminals 14 and 15 of the relay 60 by resistors 64 and 68 and optional resistors 65 and 67. Resistors 65 and 67 limit the power applied to the relay 60. Resistors 64 and 68 provide an electrical supply for the load current carrying portion of the relay 60. A gate electrode 73 of the SCR 70 is connected to the junction 66 joining resistors 64 and 65, thus establishing an electrical connection between the gate electrode 73 and the high current terminal 62. Similarly, a gate electrode 77 of the SCR 74 is electrically connected to the other high current terminal 63 by its connection at the junction 69 between resistors 67 and 68. The diode 78, having an anode 79 connected to the high current terminal 62 and a cathode 80 connected to the junction 66, prevents reverse bias damage to the gate cathode junction of SCR 70 when the instantaneous AC voltage at the high current terminal 62 is greater than that at the high current terminal 63. Similarly, a diode 81, having an anode 82 connected to the high current terminal 63 and a cathode 83 connected to the junction 69, prevents damage to SCR 74 when the instantaneous AC voltage at the high current terminal 63 is greater than that at the high current terminal 62.

An optional series resistive-capacitive snubber network comprising a resistor 84 and a capacitor 85 is connected between the high current terminals 62 and 63. The function of this snubber network, as is well known to those skilled in the art, is to prevent the SCR's 70 and 74 from inadvertently triggering. Although this snubber network is shown in FIG. 3 as being part of the high current switch, the snubber network may be externally connected to the high current terminals 62 and 63 if it is desired to integrate the high current switch.

The high current switch switches current between the high current terminals 62 and 63 in direct accordance with the flow of current between the load current terminals 14 and 15 of the relay 60. When the terminal 62 experiences a greater voltage than the terminal 63 and the relay 60 switches, a current flow from the load current terminal 14 to the load current terminal 15 is established. Current flows through resistors 67 and 68, and the voltage at junction 69 rises which triggers the SCR 74. It conducts the relatively high current from the high current terminal 62 to the high current terminal 63. The SCR 70 is reverse biased and nonconductive. Similarly, when the voltage at the terminal 63 is greater than that at the terminal 62 and the relay 60 triggers, a current flow from the load current terminal 15 to the load current terminal 14 is established. This current flow causes the voltage at junction 66 to rise and trigger the SCR 70. The SCR 70 conducts the relatively high current from the high current terminal 63 to the high current terminal 62. The SCR 74 is reverse biased and nonconductive. It can readily be understood from this description that the relatively high current flowing between the terminals 62 and 63 follows in direct accordance with the flow of current between the load current terminals 14 and 15, both in the direction and in the time at which the current flow is initiated or terminated.

Another embodiment of the high current switch is shown in FIG. 4. The zero voltage switching relay 60 is once again connected to the high current switch at the load current terminals 14 and 15, and the previously described optional snubber network comprising the resistor 84 and capacitor 85 is connected to the high current terminals 62 and 63.

In FIG. 4, the high current switch comprises a bidirectional triode thyristor 87 having a first anode electrode 88 and a second anode electrode 89 connected to the high current terminals 62 and 63. A voltage divider comprising resistors 86 and 91 is connected between the high current terminals 62 and 63 to limit the voltage and power applied to the relay 60. The load current terminal 14 connects directly to a mid-point junction 92 joining the resistors 86 and 91. The other load current terminal 15 is connected to a gate electrode 90 of the bidirectional triode thyristor 87.

The high current switch of FIG. 4 functions as follows. The solid state relay 60, functioning as previously described, is used as a trigger for the bidirectional triode thyristor 87. When the relay 60 becomes conductive it conducts current in either direction between the load current terminals 14 and 15 and triggers the bidirectional triode thyristor 87. It conducts relatively high currents between the high current terminals 62 and 63 in direct accordance with the flow of current between the load current terminals, both in the direction and in the time at which the current flow is initiated or terminated.

The foregoing specification has provided a detailed description of varied forms embodying this invention directed toward a solid state zero voltage switching relay.

Although certain embodiments of the invention have been shown and described, those skilled in the art will perceive changes and modifications without departing from the invention, and it is intended by the appended claims to cover all such modifications and changes as fall within the true spirit and scope of this invention.

What is claimed as new and desired to be secured by Letters Patent of the United States is:

1. A solid state relay comprising:

a. a pair of load current terminals;

b. a photon-activated switching means for controlling the flow of current through said load current terminals and having a lightactivated silicon controlled rectifier with main current carrying anode and cathode electrodes and a gate electrode, said silicon controlled rectifier having reduced photon sensitivity in proportion to the magnitude of the current flowing through said gate electrode;

c. a photon generator comprising a light emitting diode in a photon coupled relation with said switching means and having a pair of control signal input terminals;

d. means for controlling the gate electrode current flow of said silicon controlled rectifier including a bias signal-responsive variable impedance in series circuit relation with said gate electrode, said variable impedance comprising a transistor having a collector electrode connected to said gate electrode, an emitter electrode connected to said cathode electrode, and a base electrode;

e. bias signal generating means electrically connected to said base electrode and to said load current terminals and arranged for maintaining the variable impedance in a low impedance state except when the voltage difference between said load current terminals is equal to or near zero, wherein a full wave diode bridge means for rectifying an alternating current electrically connects said load current terminals to said pair of main current carrying anode and cathode electrodes and to said bias signal generating means; and f. a high current switch connected to said pair of load current terminals for correspondingly switching current between a pair of high current terminals in direct accordance with the flow of current between said load current terminals.

2. The solid state relay as recited in claim 1 wherein:

a. said high current switch comprises first and second silicon controlled rectifiers, each of the silicon controlled rectifiers including anode, cathode and gate electrodes, the anode and cathode electrodes connecting each silicon controlled rectifier to the high current terminals in parallel inverse relation;

b. the gate electrode of said first silicon controlled rectifier being electrically connected to one of said pair of load current terminals; and c. the gate electrode of said second silicon controlled rectifier being electrically connected to the other of said pair of load current terminals.

3. The solid state relay as recited in claim 1 wherein:

a. said high current switch comprises a bidirectional triode thyristor having first and second anode electrodes and a gate electrode, the first and second anode electrodes being connected to the high current terminals;

b. the gate electrode of said bidirectional triode thyristor being electrically connected to one of said pair of load current terminals; and further including c. a voltage divider connected between the high current terminals and having a mid-point junction electrically connected to the other of said pair of load current terminals.

4. The solid state relay as recited in claim 1 comprising a second light-activated silicon controlled rectifier that is similar to and is connected in parallel inverse relation with said light-activated silicon controlled rectifier and is in a photon coupled relation with said light emitting diode, and wherein said transistor is an NPN transistor and said relay further comprises a second NPN transistor having collector and emitter electrodes respectively connected to the gate and cathode electrodes of said second light-activated silicon controlled rectifier and having a base electrode for receiving a bias signal from said bias signal generating means.

5. The solid state relay as recited in claim 20 wherein:

a. said high current switch comprises first and second silicon controlled rectifiers, each of the silicon controlled rectifiers including anode, cathode and gate electrodes, the anode and cathode electrodes connecting each silicon controlled rectifier to the high current terminals in parallel inverse relation;

b. the gate electrode of said first silicon controlled rectifier being electrically connected to one of said pair of load current terminals; and c. the gate electrode of said second silicon controlled rectifier being electrically connected to the other of said pair of load current terminals.

6. The solid state relay as recited in claim 4 wherein:

a. said high current switch comprises a bidirectional triode thyristor having first and second anode electrodes and a gate electrode, the first and second anode electrodes being connected to the high current terminals;

b. the gate electrode of said bidirectional triode thyristor being electrically connected to one of said pair of load current terminals; and further including c. a voltage divider connected between the high current terminals and having a mid-point junction electrically connected to the other of said pair of load current terminals.

* * * * *

UNITED STATES PATENT OFFICE

CERTIFICATE OF CORRECTION

PATENT NO. 3,816,763

DATED : June 11, 1974

INVENTOR(S) : Sebald R. Korn, Richard W. Fox, William H. Sahm, III

It is certified that error appears in the above-identified patent and that said Letters Patent are hereby corrected as shown below:

Column 10, Line 60: Claim reference numeral "20" should read -- 4 --.

Signed and sealed this 27th day of May 1975.

(SEAL)
Attest:

RUTH C. MASON
Attesting Officer

C. MARSHALL DANN
Commissioner of Patents
and Trademarks